(12) United States Patent
Wakayama et al.

(10) Patent No.: US 9,836,429 B2
(45) Date of Patent: Dec. 5, 2017

(54) SIGNAL TRANSMISSION CIRCUIT AND PRINTED CIRCUIT BOARD

(71) Applicant: Hitachi, Ltd., Tokyo (JP)

(72) Inventors: Nobuhiko Wakayama, Tokyo (JP); Akio Ikeya, Tokyo (JP)

(73) Assignee: HITACHI, LTD., Tokyo (JP)

( * ) Notice: Subject to any disclaimer, the term of this patent is extended or adjusted under 35 U.S.C. 154(b) by 181 days.

(21) Appl. No.: 14/766,294

(22) PCT Filed: Nov. 6, 2013

(86) PCT No.: PCT/JP2013/080007
§ 371 (c)(1),
(2) Date: Aug. 6, 2015

(87) PCT Pub. No.: WO2015/068225
PCT Pub. Date: May 14, 2015

(65) Prior Publication Data
US 2015/0370748 A1    Dec. 24, 2015

(51) Int. Cl.
*G06F 13/00* (2006.01)
*G06F 13/42* (2006.01)
(Continued)

(52) U.S. Cl.
CPC ...... *G06F 13/4221* (2013.01); *G06F 13/4022* (2013.01); *H05K 1/0251* (2013.01); *H05K 1/0298* (2013.01)

(58) Field of Classification Search
CPC .......... G06F 13/4221; G06F 13/4022; H05K 1/0251; H05K 1/0298
See application file for complete search history.

(56) References Cited

U.S. PATENT DOCUMENTS 5,488,542 A * 1/1996 Ito ................ H01L 23/5385
174/259
7,338,290 B2 * 3/2008 Motohashi ......... H05K 1/117
439/55
(Continued)

FOREIGN PATENT DOCUMENTS

JP    2003-163467 A    6/2003
JP    2011-091141 A    5/2011
(Continued)

*Primary Examiner* — Jing-Yih Shyu
(74) *Attorney, Agent, or Firm* — Volpe and Koenig, P.C.

(57) ABSTRACT

The present invention aims to improve the signal transmission characteristics by shortening the length of the detour path of the return current. The present invention comprises a return current transmission path relative to a signal transmission path for transmitting signals. The signal transmission path includes a signal pad formed on a circuit board surface layer, and signal through-holes formed on the circuit board surface layer and a circuit board inner layer and connected to the signal pad. The return current transmission path includes a ground pad formed on the circuit board surface layer, and a plurality of ground through-holes formed on the circuit board surface layer and the circuit board inner layer and connected to the ground pad and a ground layer of the circuit board inner layer. Each of the ground through-holes is arranged by being separated on either side of the ground pad.

11 Claims, 12 Drawing Sheets

(51) Int. Cl.
*H05K 1/02* (2006.01)
*G06F 13/40* (2006.01)

(56) References Cited

U.S. PATENT DOCUMENTS

| | | | | |
|---|---|---|---|---|
| 7,579,925 | B2 * | 8/2009 | Fan | H01P 5/02 |
| | | | | 333/246 |
| 7,671,613 | B1 * | 3/2010 | Campbell | G01R 1/06788 |
| | | | | 324/754.11 |
| 8,136,074 | B2 * | 3/2012 | Sadamatsu | G06F 17/5068 |
| | | | | 716/120 |
| 9,006,910 | B2 * | 4/2015 | Oikawa | H01L 23/66 |
| | | | | 257/786 |
| 9,140,724 | B1 * | 9/2015 | Campbell | G01R 1/06788 |
| 9,404,940 | B1 * | 8/2016 | Campbell | G01R 1/06788 |
| 2002/0176236 | A1 * | 11/2002 | Iguchi | H05K 1/0216 |
| | | | | 361/753 |
| 2003/0053302 | A1 * | 3/2003 | Kelly | H05K 1/0233 |
| | | | | 361/780 |
| 2004/0144562 | A1 * | 7/2004 | Ishikawa | H05K 1/025 |
| | | | | 174/255 |
| 2009/0014206 | A1 * | 1/2009 | Motohashi | H05K 1/114 |
| | | | | 174/262 |
| 2011/0222247 | A1 | 9/2011 | Motohashi et al. | |
| 2013/0327565 | A1 * | 12/2013 | Qu | H05K 1/116 |
| | | | | 174/266 |

FOREIGN PATENT DOCUMENTS

| | | |
|---|---|---|
| JP | 2011-192715 A | 9/2011 |
| JP | 2011-234195 A | 11/2011 |

\* cited by examiner

| PIN NUMBER | SIGNAL ASSIGNMENT |
|---|---|
| S1 | GROUND |
| S2 | PORT 1 Tx P POLE |
| S3 | PORT 1 Tx N POLE |
| S4 | GROUND |
| S5 | PORT 1 Rx N POLE |
| S6 | PORT 1 Rx P POLE |
| S7 | GROUND |
| S8 | GROUND |
| S9 | PORT 2 Tx P POLE |
| S10 | PORT 2 Tx N POLE |
| S11 | GROUND |
| S12 | PORT 2 Rx N POLE |
| S13 | PORT 2 Rx P POLE |
| S14 | GROUND |

FIG.7

| PIN NUMBER | SIGNAL ASSIGNMENT |
|---|---|
| 12 Side B | NOT ASSIGNED |
| 13 Side B | GROUND |
| 14 Side B | LANE 0 Tx P POLE |
| 15 Side B | LANE 0 Tx N POLE |
| 16 Side B | GROUND |
| 17 Side B | CONTROL SIGNAL |
| 18 Side B | GROUND |
| 12 Side A | GROUND |
| 13 Side A | REFERENCE CLOCK P POLE |
| 14 Side A | REFERENCE CLOCK N POLE |
| 15 Side A | GROUND |
| 16 Side A | LANE 0 Rx P POLE |
| 17 Side A | LANE 0 Rx N POLE |
| 18 Side A | GROUND |

FIG.8

| PIN NUMBER | SIGNAL ASSIGNMENT |
|---|---|
| 2 | GROUND |
| 3 | DQ0 |
| 4 | DQ1 |
| 5 | GROUND |
| 6 | DQS0 N POLE |
| 7 | DQS0 P POLE |
| 8 | GROUND |
| 9 | DQ2 |
| 10 | DQ3 |
| 11 | GROUND |
| 12 | DQ8 |
| 13 | DQ9 |
| 14 | GROUND |
| 15 | DQS1 N POLE |
| 16 | DQS1 P POLE |

SIGNAL TRANSMISSION CIRCUIT AND PRINTED CIRCUIT BOARD

TECHNICAL FIELD

The present invention relates to a signal transmission circuit and a printed circuit board using, as a signal transmission path, a circuit board on which is mounted a surface-mounting connector for high-speed signals.

BACKGROUND ART

In recent years, speeding up of the transmission rate with regard to interface signals is in progress. For example, regarding SAS (Serial Attached Small Computer System Interface), the maximum signal transmission stipulated in rate in which standards have been stipulated by ANSI (American National Standards Institute) is 3 Gbps in the initial standard SAS-1, 6 Gbps in the currently mainstream SAS-2, and 12 Gbps in the latest standard SAS-3.

Moreover, regarding PCI Express (Peripheral Component Interconnect Express), the maximum signal transmission rate in which standards have been stipulated by PCI-SIG (PCI Special Interest Group) is 2.5 Gbps in the initial standard Gen1, 5 Gbps in the currently mainstream Gen2, 8 Gbps in Gen3, and 16 Gbps in Gen4 for which the standard is currently being established.

Moreover, with DDR SDRAM (Double Data Rate Synchronous Dynamic Random Access Memory), the maximum signal transmission rate in which standards have been established by JEDEC (Solid State Technology Association) is 1066 Mbps in the older generation DDR2, 2133 Mbps in the currently mainstream DDR3, and 3200 Mbps in the latest standard DDR4.

In order to realize speeding up of such signal transmission rates, the necessity of ensuring the signal transmission quality is increasing even more by preparing a return current path of the ground through which return current will flow against a signal current path so as to obtain an appropriate characteristic impedance, and controlling electromagnetic coupling of the signal current path and the return current path. In light of the above, it is particularly important to design a transmission system comprising a return current path along a signal current path in order to ensure the signal quality.

As a conventional technology aiming to ensure the return current path along the signal current path is publicly known as, for instance, described in PTL 1. The method of ensuring the return current path described in PTL 1 is a method of connecting a plurality of ground layers with multiple through-holes, and preventing the disruption of return current by providing a detour path of the return current to another ground layer via the through-holes even under a mounting condition where the ground layer adjacent to signal wiring is disconnected midway.

CITATION LIST

Patent Literature

[PTL 1] Japanese Patent Application Publication No. 2003-163467

SUMMARY OF INVENTION

Technical Problem

Nevertheless, even in cases where a detour path is ensured, the wavelength of signals is becoming even shorter pursuant to even higher transmission rates in recent years, and it is no longer possible to ignore the influence on the signal quality by the length itself for detouring the return current.

Specifically, pursuant to speeding up of the signal transmission rates in recent years, even with parts that were conventionally developed specifically for high-speed transmission, the detour of the return current based on micro mounting structures sometimes affects the quality of transmission signals. The detour of the return current that occurs when a surface-mounting connector for high-speed signal transmission is mounted on a circuit board based on conventional technologies, and the influence thereof, are now explained along with the drawings.

As a surface-mounting connector for high-speed signal transmission, for instance, a SAS connector or the like may be considered. Moreover, as a representative example of a transmission system using a surface-mounting connector for high-speed signal transmission, considered may be a transmission system that connects the device and the controller in SAS, PCI Express, DDR SDRAM or the like.

FIG. 6 is a pin arrangement configuration diagram showing a part of the pin arrangement of an SAS connector in which standards have been established by ANSI. In FIG. 6, as the pins related to the high-speed signals of the SAS connector, there are a total of 14 pins; specifically, 8 signal pins (pin numbers S2, S3, S5, S6, S9, S10, S12, S13) and 6 ground pins (pin numbers S1, S4, S7, S8, S11, S14).

FIG. 7 is a pin arrangement configuration diagram showing a part of the pin arrangement of a PCI Express connector in which standards have been established by PCI-SIG. In FIG. 7, while the pins related to high-speed signals differ depending on the number of lanes, in the case of a 1-lane connector having the fewest number of pins, for instance, there are a total of 8 pins; specifically, 4 signal pins (pin numbers 14 Side B, 15 Side B, 16 Side A, 17 Side A), and 4 ground pins (pin numbers 13 Side B, 16 Side B, 15 Side A, 18 Side A).

FIG. 8 is a pin arrangement configuration diagram showing a part of the pin arrangement of a DDR3 connector in which standards have been established by JEDEC. In FIG. 8, as certain pins in the DDR connector, there are 10 signal pins (pin numbers 3, 4, 6, 7, 9, 10, 12, 13, 15, 16), and 5 ground pins (pin numbers 2, 5, 8, 11, 14). Note that the total number of pins in a DDR3 connector is 240 pins, and the total number of pins in a DDR4 connector is 288 pins.

As an example of the connection between the controller and the device, FIG. 9 shows a schematic diagram of the transmission system between the HDD (Hard Disk Drive) and the controller. In FIG. 9, a female connector 150 and a controller 400 are mounted on a printed circuit board 100. The female connector 150 is connected to a male connector 160, and the male connector 160 is connected to an HDD circuit board 200. An I/O chip 300 and an output circuit 301 are mounted on the HDD circuit board 200. On the controller 400 are mounted an input circuit 401, as well as a signal processing circuit and an output circuit (both not shown).

Here, when data is transferred between the controller 400 and the device (HDD), for instance, when signals are transmitted from the device (HDD) to the controller 400, the signals output from the output circuit 301 within the I/O chip 300 pass through the through-holes and inner layer signal layer wirings on the circuit board 100 via the wirings on the HDD 200 and the male connector 160 and the female connector 150, and thereafter reach the input circuit 401 within the controller 400.

FIG. 10 is an enlarged perspective view of the section enclosed with a dotted line C in the transmission system illustrated in FIG. 9. Note that, for simplification, FIG. 10 only illustrates a total of 4 pins as the connector pins; specifically, 2 signal pins and 2 ground pins. As the actual connector, the controller shown in FIG. 6 to FIG. 8 is used.

In FIG. 10, the male connector 160 has ground pins 1p, 1P, and differential signal pins 2p, 2P, and a part of the male connector 160 is detachably inserted into the female connector 150. The female connector 150 is mounted on the printed circuit board 100. Among the parts coupling patterns (hereinafter referred to as the "pads"), parts coupling patterns for grounds (hereinafter referred to as the "ground pads") 1a, 1A and parts coupling patterns for signals (hereinafter referred to as the "signal pads") 2a, 2A are arranged on the printed circuit board 100, ground pins 1q, 1Q are soldered onto the ground pads 1a, 1A, differential signal pins 2q, 2Q are soldered onto the signal pads 2a, 2A, and the female connector 150 is thereby configured as the surface-mounting connector.

The ground pads 1a, 1A are connected to a ground layer (not shown) via wirings 1b, 1B and ground through-holes 1c, 1C arranged on the printed circuit board 100. The signal pads 2a, 2A are connected to the inner layer signal layer wirings 20, 21 via wirings 2b, 2B and signal through-holes 2c, 2C arranged on the printed circuit board 100. Moreover, ground pins 1q, 1Q are connected to ground pins 1p, 1P of the male connector 160 when the male connector 160 and the female connector 150 are coupled. Differential signal pins 2q, 2Q are connected to differential signal pins 2p, 2P of the male connector 160 when the male connector 160 and the female connector 150 are coupled.

Here, when the differential signals output from the output circuit 301 on the HDD circuit board 200 are transmitted to the printed circuit board 100 via the male connector 160 and the current thereof flows through an ideal path, the signal current will flow along signal current paths 6j, 6J, and the return current will flow along return current paths 5j, 5J.

Accordingly, the signal transmission quality can be ensured by preparing the return current paths 5j, 5J, through which the return current will flow, relative to the signal current paths 6j, 6J, and controlling the electromagnetic coupling between the signal current paths 6j, 6J and the return current paths 5j, 5J so as to obtain appropriate characteristic impedance.

Nevertheless, pursuant to higher signal transmission rates, the detour path of the return current, which was conventionally not a problem, is now becoming notable as a problem, and sometimes affects the signal quality. This phenomenon is explained below.

FIG. 11 is a plan view of the principal part of a printed circuit board on which surface-mounting pads of a conventional structure are arranged. FIG. 11A is a vertical sectional view of the xz plane direction along the straight line A of FIG. 11. FIG. 11B is a vertical sectional view of the xz plane direction along the straight line B of FIG. 11.

In FIG. 11, the signal pads 2a, 2A to be connected to the differential signal pins 2q, 2Q of the female connector 150 are connected to the signal through-holes 2c, 2C via the wirings 2b, 2B. The signal through-holes 2c, 2C are connected to the inner layer signal layer wiring 20 as shown in FIG. 11A. Similarly, the ground pads 1a, 1A to be connected to the ground pins 1q, 1Q of the female connector 150 are connected to the ground through-holes 1c, 1C via the wirings 1b, 1B. The ground through-holes 1c, 1C are connected to the ground layers 10, 11 as shown in FIG. 11B.

The dimension of the respective parts illustrated in FIG. 11, FIG. 11A and FIG. 11B is set to the following values as standard examples. The size of the ground pads 1a, 1A and the signal pads 2a, 2A is 3 mm in the x direction and 0.65 mm in the y direction, and the pitch of the respective pads in the y direction is 1.27 mm. The wirings 1b, 1B, 2b, 2B drawn out from the ground pads 1a, 1A and the signal pads 2a, 2A have a wiring width of 0.5 mm and a wiring length of 0.85 mm. The inner layer signal layer wiring 20 has a wiring width of 0.1 mm and a wiring length of 0.23 mm. The insulation layer thickness between the ground pads 1a, 1A and the ground layer 10 adjacent to the ground pads 1a, 1A directly underneath is 0.175 mm, and the insulation layer thickness between the inner layer signal layer wiring 20 and the ground layer 11 adjacent to the inner layer signal layer wiring 20 directly underneath is 0.107 mm. The plate thickness of the printed circuit board 100 is 4.6 mm, and the finished diameter of the ground through-holes 1c, 1C and the signal through-holes 2c, 2C is 0.3 mm.

In FIG. 11A, when signals are transmitted from the signal pin 2q toward the inner layer signal layer wiring 20, a signal current path 6k connecting the signal pin 2q and the inner layer signal layer wiring 20 is formed. The ideal return current path relative to the signal current path 6k is the path connecting the ground layer 11 and the ground pad 1a shown in FIG. 11B.

Nevertheless, since the distance between the signal pads 2a, 2A and the ground layer 10 is shorter than the distance between the signal pads 2a, 2A and the ground pads 1a, 1A, the electromagnetic coupling of the signal pads 2a, 2A and the ground layer 10 becomes stronger than the electromagnetic coupling of the signal pads 2a, 2A and the ground pads 1a, 1A. Thus, as shown in FIG. 11A, when a signal current flows through the signal pad 2a, the return current attempts to flow along the return current path 5s within the ground layer 10 that is adjacent directly underneath the signal pad 2a.

Nevertheless, since the return current that flows along the return current path 5s within the ground layer 10 needs to ultimately reach the ground pin 1q, as shown in FIG. 11B, the return current flows through the return current path 5t which turns back within the ground layer 10 directly underneath the end of the ground pad 1a and returns into the ground layer 10 directly underneath the ground through-hole 1c, and thereafter flows through the return current path 5k that connects the ground through-hole 1c, the wiring 1b, the ground pad 1a, and the ground pin 1q. In other words, the return current flows along the return current paths 5u, 5s, 5t, 5k, and the return current paths 5s, 5t become the detour paths of the return current.

Note that the return current path 5s in the ground layer 10 actually flows directly underneath the signal pad 2a as shown in FIG. 11A, but the return current path 5s has been indicated as a broken line for the sake of convenience in FIG. 11B in order to facilitate the understanding of the detour path of the return current.

Here, the time required for the return current to pass through the return current paths 5s, 5t (total length=approximately 7.5 mm), which are the detour paths of the return current, is roughly 50 ps, and it is anticipated that resonance will arise near 10 GHz having 50 ps as the half wave.

In order to confirm the foregoing phenomenon, a conventional model including the surface-mounting pads to which the mounting conditions of FIG. 11, FIG. 11A and FIG. 11B were applied and the entire range of the circuit board illustrated in FIG. 11, FIG. 11A and FIG. 11B was used, and the differential signal transmission characteristics (hereinafter referred to as "Sdd21") from the signal pads 2a, 2A to the inner layer signal layer wirings 20, 21 in this conventional model were calculated using a 3D electromagnetic field simulator (HFSS manufactured by Ansys). The respective dimensions of this conventional model are the values of the surface-mounting pads illustrated in FIG. 11.

The simulation results of the conventional model are shown with a performance curve 500 (broken line) of FIG. 2. From the simulation results shown in FIG. 2, it can be seen that a resonance point exists near 10 GHz in the differential signal. Here, as anticipated above, it was confirmed that the return current paths 5s, 5t as the detour paths of the return current were the main cause of the resonance point near 10 GHz of the differential signal. Pursuant to higher signal transmission rates, the influence of this resonance on the signal transmission quality will increase.

As described above, when differential signals flow through the signal pads 2a, 2A of the surface-mounting connector for high-speed signals and a return current flows through the ground pads 1a, 1A, and detour paths of the return current are formed in the return current path in the course of the return current path being formed on the ground and the length of such detour paths becomes long, there is a problem in that the influence on the signal transmission quality will increase pursuant to higher signal transmission rates.

An object of the present invention is to provide a signal transmission circuit and a printed circuit board capable of improving the signal transmission characteristics by shortening the length of the detour path of the return current.

Solution to Problem

In order to achieve the foregoing object, the present invention is characterized in that a return current transmission path against a signal transmission path is configured from a ground pad formed on a circuit board surface layer and a plurality of ground through-holes connected to the ground pad, and the plurality of ground through-holes are configured from at least one or more ground through-holes that are arranged adjacent to signal through-holes in the signal transmission path, and at least one or more ground through-holes that are arranged on a side opposite to the ground through-holes with the ground pad positioned therebetween.

Advantageous Effects of Invention

According to the present invention, signal transmission characteristics can be improved by shortening the length of the detour path of the return current.

BRIEF DESCRIPTION OF DRAWINGS

FIG. 7 is a configuration diagram showing an extract of a part of the pin arrangement of the PCI Express connector.

FIG. 8 is a configuration diagram showing an extract of a part of the pin arrangement of the DDR3 connector.

DESCRIPTION OF EMBODIMENTS

Embodiments of the present invention are now explained with reference to the appended drawings. Note that, while the embodiments show examples of comprising one ground pad relative to one signal pad, the present invention can be applied to any circuit board comprising at least one signal pad and one ground pad. Moreover, while a differential signal is exemplified as the signal, the present invention can be applied to both differential signals and single-end signals.

First Embodiment

Figure 1:
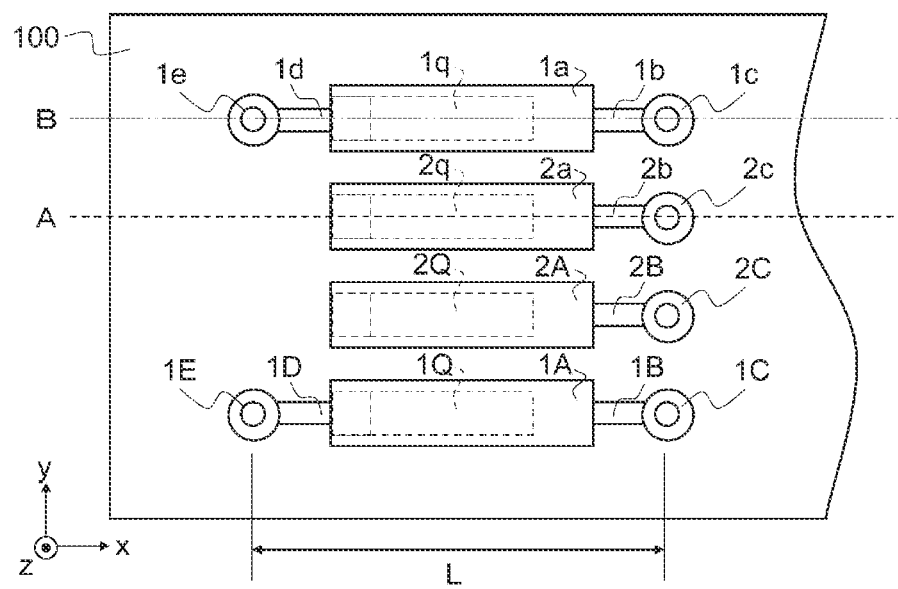
FIG. 1 is a diagram showing the first embodiment of the present invention, and is a plan view of the principal part of the printed circuit board on which is mounted a surface-mounting connector for high-speed signals.
Figure 1A:
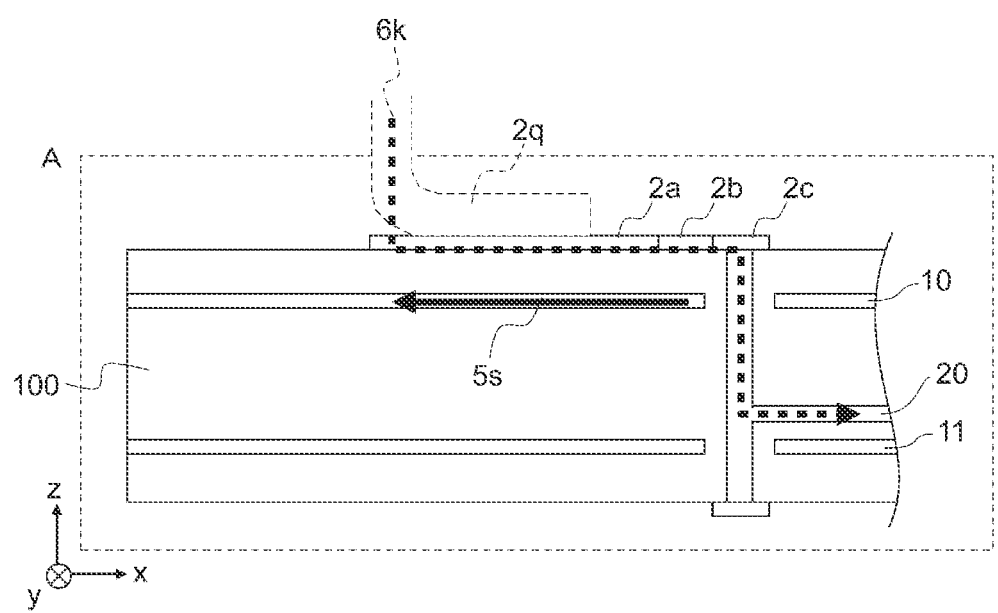
FIG. 1A is a vertical sectional view of the xz plane direction along the straight line A of FIG. 1.
Figure 1B:
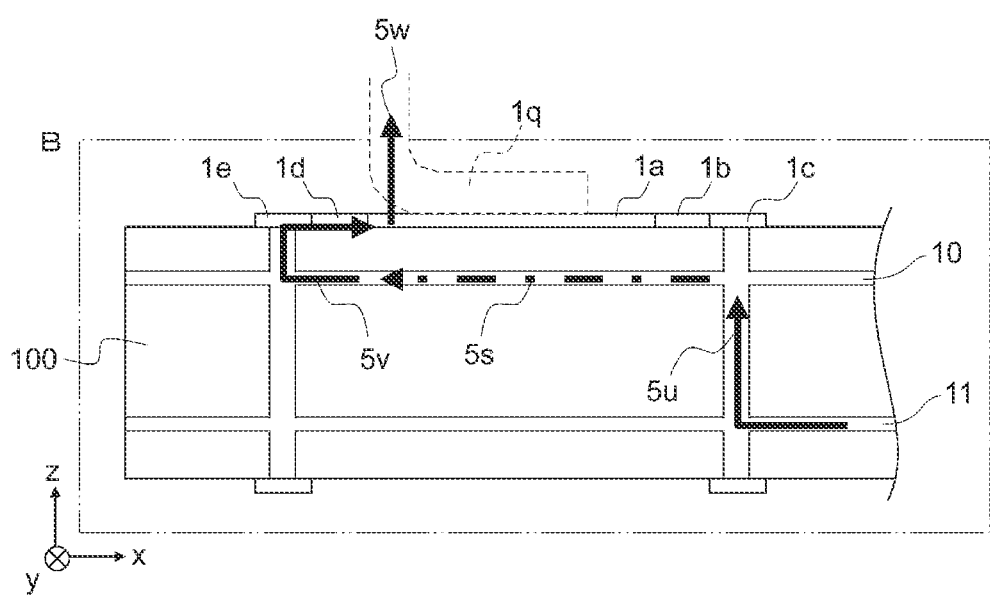
FIG. 1B is a vertical sectional view of the xz plane direction along the straight line B of FIG. 1.

FIG. 1 is a plan view of the principal part of the printed circuit board on which is mounted a surface-mounting connector for high-speed signals according to the present invention. FIG. 1A is a vertical sectional view of the xz plane direction along the straight line A of FIG. 1. FIG. 1B is a vertical sectional view of the xz plane direction along the straight line B of FIG. 1.

Figure 9:
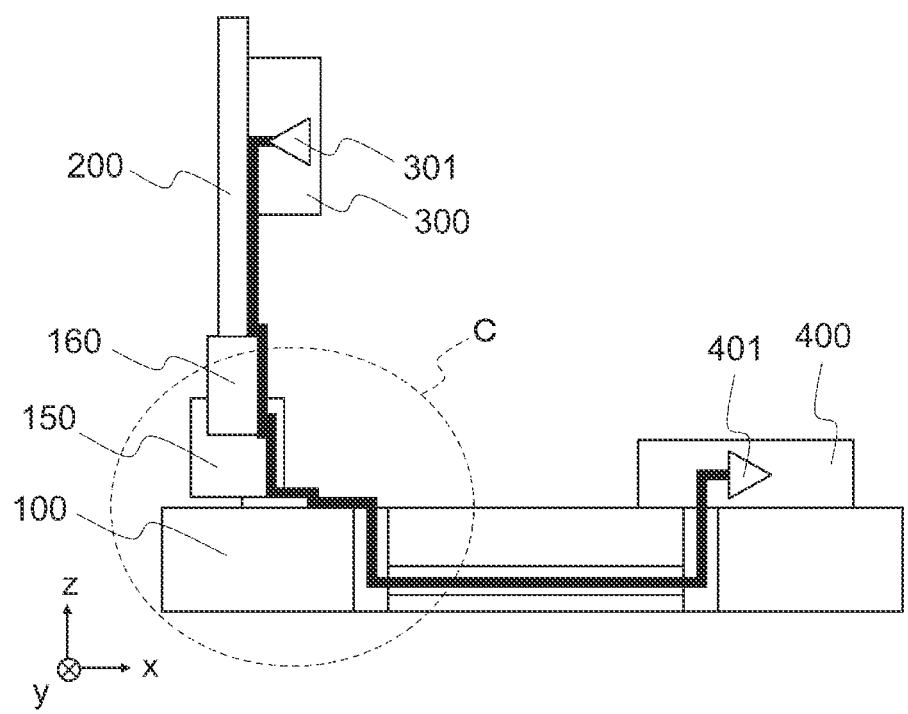
FIG. 9 is a schematic configuration diagram of the transmission system between the HDD and the controller.

In FIG. 1, the printed circuit board 100 is a surface-mounting connector for high-speed signals which is configured, for example, from a printed circuit board on which a female connector 150 (see FIG. 9) is mounted. Rectangular ground pads 1a, 1A and rectangular signal pads 2a, 2A are arranged, as surface-mounting connector pads, in the x direction and to be mutually parallel on the circuit board surface layer of the printed circuit board 100. One end of the ground pins 1q, 1Q is soldered onto the ground pads 1a, 1A and one end of the differential signal pins 2q, 2Q is soldered onto the signal pads 2a, 2A. Moreover, on the circuit board surface layer of the printed circuit board 100, the wirings 1b, 1B, 2b, 2B, 1d, 1D are arranged along the x direction, and the ground through-holes 1c, 1C, 1e, 1E and the signal through-holes 2c, 2C are arranged along the x direction. Furthermore, the ground through-holes 1c, 1C, 1e, 1E and the signal through-holes 2c, 2C are formed on the printed circuit board 100 along the z direction.

One end of the ground pads 1a, 1A in the x direction is connected to the ground layers 10, 11 (see FIG. 1B) in the circuit board inner layer via the wirings 1b, 1B and the ground through-holes 1c, 1C in the x-axis positive direction relative to the ground pads 1a, 1A, and the other end in the x direction is connected to the ground layers 10, 11 (see FIG. 1B) in the circuit board inner layer via the wirings 1d, 1D and the ground through-holes 1e, 1E in the x-axis negative direction relative to the ground pads 1a, 1A. In other words, one end of the rectangular ground pads 1a, 1A in the longitudinal direction is connected to the ground layers 10, 11 via the wirings 1b, 1B and the ground through-holes 1c, 1C, and the other end in the longitudinal direction is connected to the ground layers 10, 11 via the wirings 1d, 1D and the ground through-holes 1e, 1E.

At this point, it is also possible to adopt a structure where a plurality of wirings are connected to the other end (end side in the x-axis negative direction) of the ground pads 1a, 1A in the longitudinal direction, each of the wirings is connected to a plurality of ground through-holes, and each of the ground through-holes is connected to the ground layer in the insulation layer. In other words, in addition to arranging the ground through-holes 1c, 1C adjacent to the signal through-holes 2c, 2C, one or more ground through-holes can be arranged other than the ground through-holes 1e, 1E as the ground through-holes that are arranged on a side opposite to the ground through-holes 1c, 1C with the ground pads 1a, 1A positioned therebetween. Accordingly, wirings 1b, 1B, 1d, 1D in at least 2 directions are connected as lead-out wirings for each location of the ground pads 1a, 1A.

Figure 10:
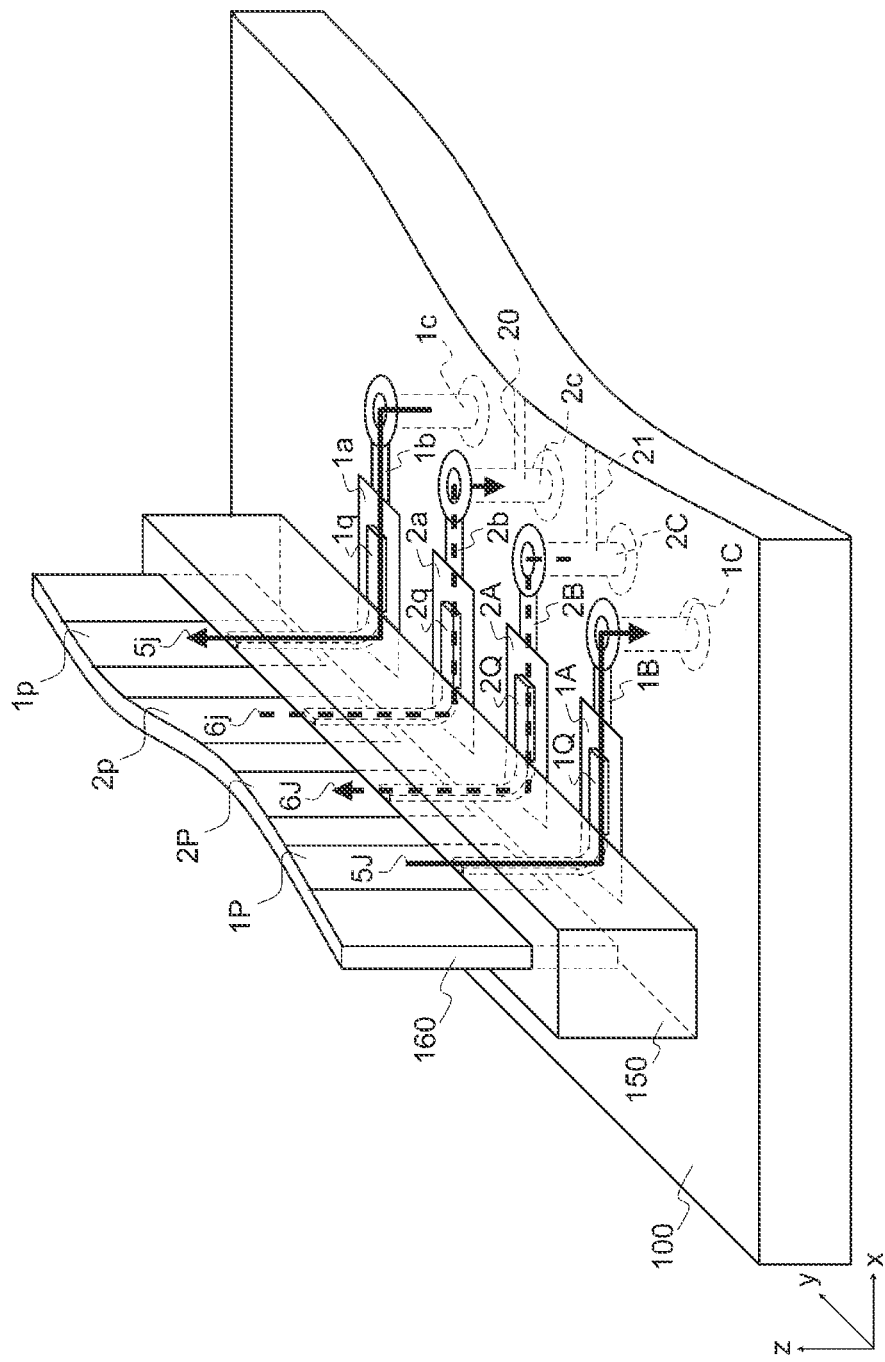
FIG. 10 is an enlarged perspective view of the connection of the connector and the printed circuit board shown in FIG. 9.
Figure 11:
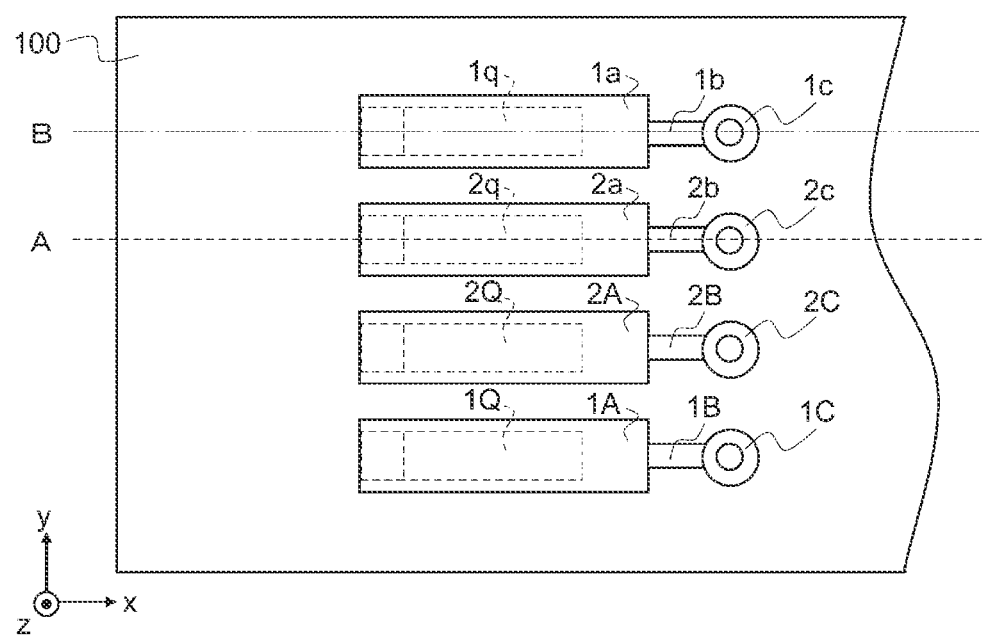
FIG. 11 is a plan view of the principal part of the printed circuit board showing a conventional example.
Figure 11A:
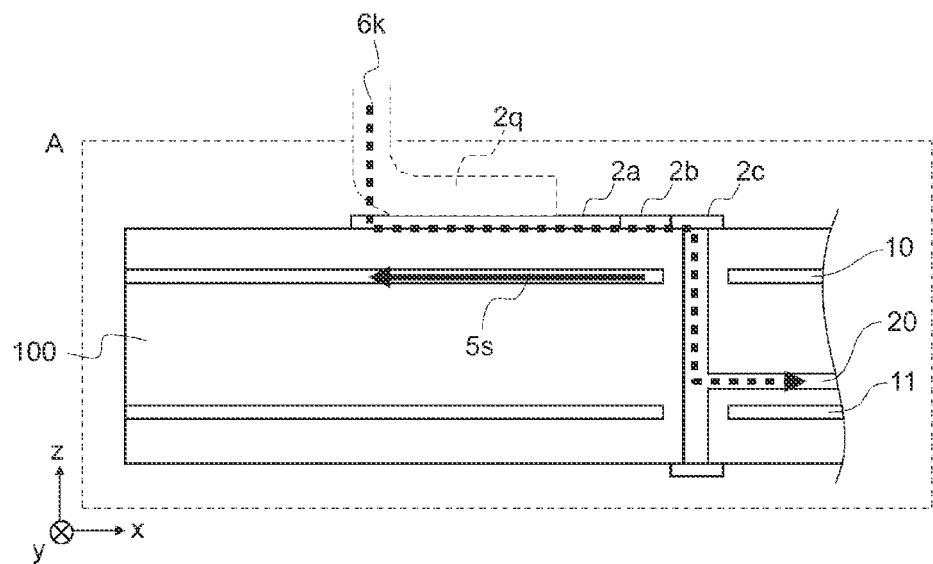
FIG. 11A is a vertical sectional view of the xz plane direction along the straight line A of FIG. 11.
Figure 11B:
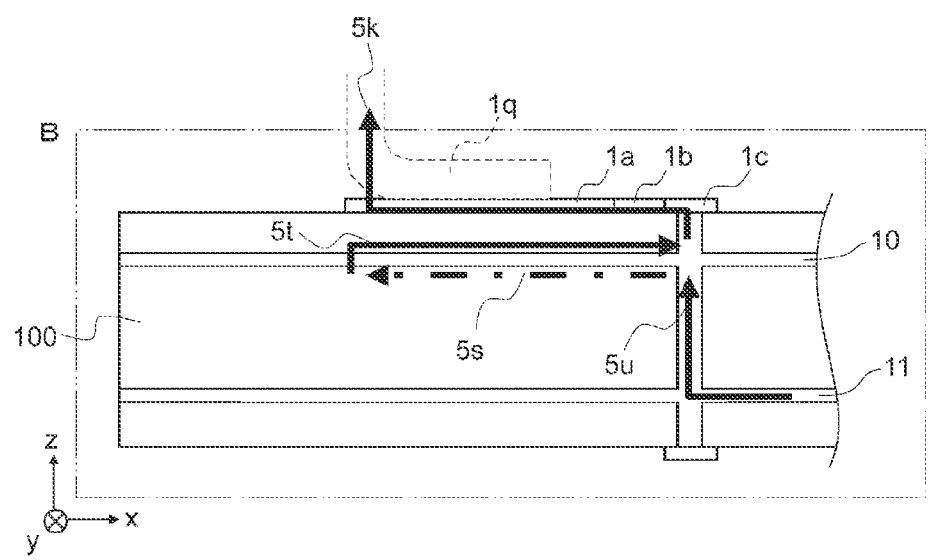
FIG. 11B is a vertical sectional view of the xz plane direction along the straight line B of FIG. 11.

The signal pads 2a, 2A are connected to the inner layer signal layer wiring 20 via the wirings 2b, 2B and the signal through-holes 2c, 2C arranged on the printed circuit board 100 (see FIG. 1A). Moreover, the ground pins 1q, 1Q are connected to the ground pins 1p, 1P of the male connector 160 when the male connector 160 and the female connector 150 are coupled (see FIG. 10). The differential signal pins 2q, 2Q are connected to the differential signal pins 2p, 2P of the male connector 160 when the male connector 160 and the female connector 150 are coupled (see FIG. 10).

The dimension of the respective parts illustrated in FIG. 1, FIG. 1A and FIG. 1B is set to the following values as standard examples. The size of the ground pads 1a, 1A and the signal pads 2a, 2A is 3 mm in the x direction and 0.65 mm in the y direction, and the pitch of the ground pads 1a, 1A and the signal pads 2a, 2A in the y direction is 1.27 mm. The distance L between the ground through-holes 1c, 1e and the distance L between the ground through-holes 1C, 1E are 5.0 mm. With the ground pads 1a, 1A and the signal pads 2a, 2A as the reference, the wiring width of the wirings 1b, 1B, 2b, 2B drawn out in the x-axis positive direction is 0.5 mm, and the length of the wirings 1b, 1B, 2b, 2B is 0.85 mm. With the ground pads 1a, 1A as the reference, the wiring width of the wirings 1d, 1D drawn out in the x-axis negative direction is 0.5 mm, and the wiring length of the wirings 1d, 1D is 1.15 mm. The wiring width of the inner layer signal layer wiring 20 is 0.1 mm, and the wiring width of the inner layer signal layer wiring 20 is 0.23 mm. The inner layer signal layer wiring 20 has a wiring width of 0.1 mm and a wiring length of 0.23 mm. The insulation layer thickness between the ground pads 1a, 1A and the ground layer 10 adjacent to the ground pads 1a, 1A directly underneath is 0.175 mm, and the insulation layer thickness between the inner layer signal layer wiring 20 and the ground layer 11 adjacent to the inner layer signal layer wiring 20 directly underneath is 0.107 mm. The plate thickness of the printed circuit board 100 is 4.6 mm, and the finished diameter of the ground through-holes 1c, 1C and the signal through-holes 2c, 2C is 0.3 mm.

In FIG. 1A, when differential signals are transmitted from the differential signal pin 2q toward the inner layer signal layer wiring 20, the signal current path 6k that connects the differential signal pin 2q and the inner layer signal layer wiring 20 is formed as a signal transmission path. The ideal return current path relative to the signal current path 6k is the return current transmission path connecting the ground layer 11 and the ground pad 1a shown in FIG. 1B.

Nevertheless, since the distance between the signal pads 2a, 2A and the ground layer 10 (distance in the z direction) is shorter than the distance between the signal pads 2a, 2A and the ground pads 1a, 1A (distance in the y direction), the electromagnetic coupling of the signal pads 2a, 2A and the ground layer 10 becomes stronger than the electromagnetic coupling of the signal pads 2a, 2A and the ground pads 1a, 1A. Thus, as shown in FIG. 1A, when a signal current flows through the signal pad 2a, the return current attempts to flow along the return current path 5s within the ground layer 10 that is adjacent directly underneath the signal pad 2a.

Nevertheless, since the return current that flows along the return current path 5s within the ground layer 10 needs to ultimately reach the ground pin 1q, as shown in FIG. 1B, the return current flows along a return current path 5v that connects the ground layer 10 directly underneath the ground through-hole 1e, the ground through-hole 1e, and the wiring 1d and the ground pad 1a without turning back to the ground through-holes 1c, 1C within the ground layer 10, and thereafter flows along a return current path 5w that connects the ground pad 1a and the ground pin 1q. Consequently, since the return current attempts to flow through the return current paths 5u, 5s, 5v, 5w as the actual return current transmission paths as shown in FIG. 1B, the detour paths of the return current can be shortened and, consequently, the detour of the return current can be reduced.

Note that the return current path 5s in the ground layer 10 actually flows directly underneath the signal pad 2a as shown in FIG. 1A, but the return current path 5s has been indicated as a broken line for the sake of convenience in FIG. 1B in order to facilitate the understanding of the detour path of the return current.

Accordingly, since the ground through-holes 1e, 1E are connected, in addition to the ground through-holes 1c, 1C, to the ground pads 1a, 1A as the ground through-holes to be connected to the ground layer 10 directly beneath the ground pads 1a, 1A and the ground layer 11 adjacent to the inner layer signal layer wiring 20, the detour paths of the return current can be shortened and the detour of the return current can consequently be reduced, and the differential signal transmission characteristics can thereby be improved.

In order to confirm the foregoing effects, a model including the surface-mounting pads to which the mounting conditions of FIG. 1, FIG. 1A and FIG. 1B were applied and the entire range of the circuit board illustrated in FIG. 1, FIG. 1A and FIG. 1B was used, and the Sdd21 (differential signal transmission characteristics) from the signal pads 2a, 2A to the inner layer signal layer wirings 20, 21 in this model were calculated using a 3D electromagnetic field simulator (HFSS manufactured by Ansys). The respective dimensions of this model are the values of the surface-mounting pads illustrated in FIG.

Figure 2:
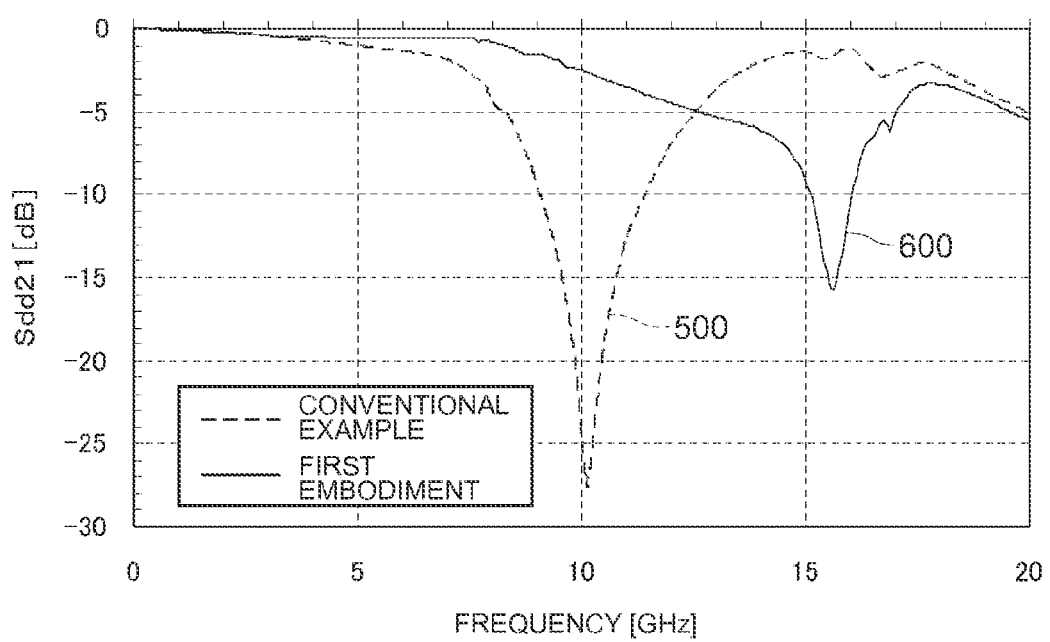
FIG. 2 is a characteristic diagram showing the differential signal transmission characteristics of the first embodiment and a conventional example.

The simulation results of this embodiment are shown in FIG. 2. In FIG. 2, a performance curve (solid line) 600 is the simulation results in the first embodiment, and a performance curve (broken line) 500 is the simulation results of the conventional example. In the conventional example, there is resonance of roughly −28 dB near 10 GHz of the differential signal, but in this embodiment, the resonance frequency of the differential signal has moved to near 16 GHz, and the absolute value thereof has decreased to roughly −16 dB. This shows that this example is compliant with faster signal transmission rates in comparison to the conventional example.

According to this embodiment, since ground through-holes 1e, 1E are connected, in addition to the ground through-holes 1c, 1C, to the ground pads 1a, 1A as the ground through-holes to be connected to the ground layer 10 directly underneath the ground pads 1a, 1A, and the detour paths of the return current are shortened and the detour of the return current is consequently reduced, the Sdd21 can be improved.

Second Embodiment

Figure 3:
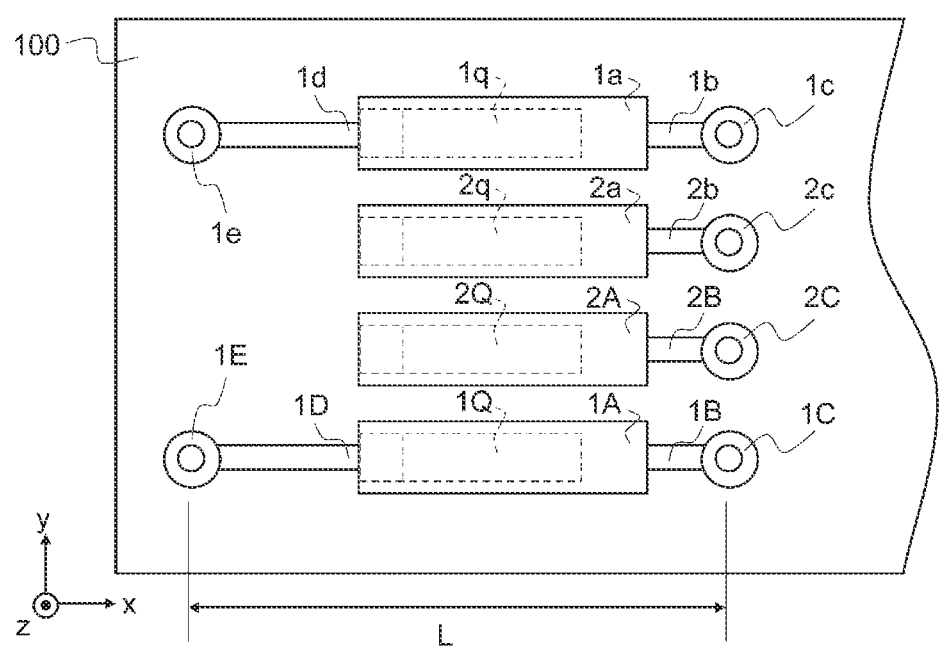
FIG. 3 is a diagram showing the second embodiment of the present invention, and is a plan view of the principal part of the printed circuit board on which is mounted a surface-mounting connector for high-speed signals.

FIG. 3 is a diagram showing the second embodiment of the present invention, and is a plan view of the principal part of the printed circuit board on which is mounted a surface-mounting connector for high-speed signals. In FIG. 3, similar to the first embodiment, rectangular ground pads 1a, 1A and rectangular signal pads 2a, 2A are arranged, as surface-mounting connector pads, in the x direction and to be mutually parallel on the printed circuit board 100, one end of the ground pins 1q, 1Q is soldered on the ground pads 1a, 1A and one end of the differential signal pins 2q, 2Q is soldered on the signal pads 2a, 2A. Here, in this embodiment, the distance L between the ground through-holes 1c, 1e and the distance L between the ground through-holes 1C, 1E can be adjusted, and the remaining configuration is the same as the first embodiment.

Figure 4:
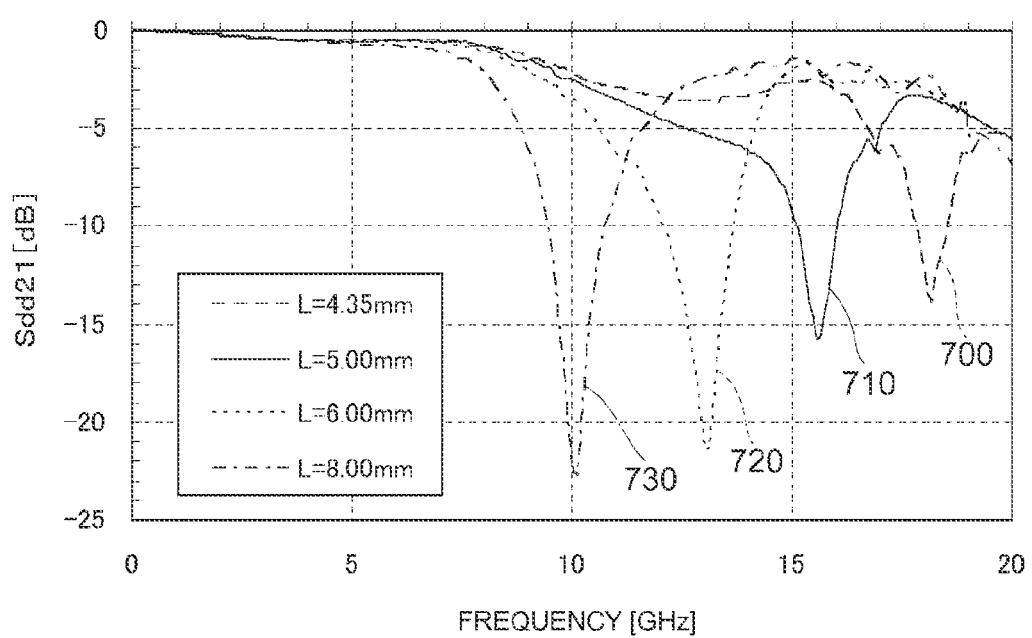
FIG. 4 is a characteristic diagram showing the differential signal transmission characteristics in the second embodiment of the present invention.

At this point, when the distance L between the ground through-holes 1c, 1e and between the ground through-holes 1C, 1E was changed and the signal (differential signal) transmission characteristics were simulated using a 3D electromagnetic field simulator (HFSS manufactured by Ansys), the results shown in FIG. 4 were obtained.

In FIG. 4, a performance curve 700 shows the simulation results when L=4.35 mm, a performance curve 710 shows the simulation results when L=5.00 mm, a performance curve 720 shows the simulation results when L=6.00 mm, and a performance curve 730 shows the simulation results when L=8.00 mm.

Based on the simulation results shown in FIG. 4, it can be understood that the frequency and Sdd21 have increased as the value of L is decreased, and the signal transmission characteristics have improved.

Here, it was considered that the frequency that is roughly 2 GHz lower from the Sdd21 resonance point in the respective performance curves 710 to 730 is the upper limit of the frequency which enables signal transmission. Here, the relationship of F [GHz] required for preventing the second harmonic of the fundamental frequency F of signals to be passed through the connector from being influenced by the resonance and the distance L [mm] between the ground through-holes is shown in FIG. 5.

Figures 5, 6:
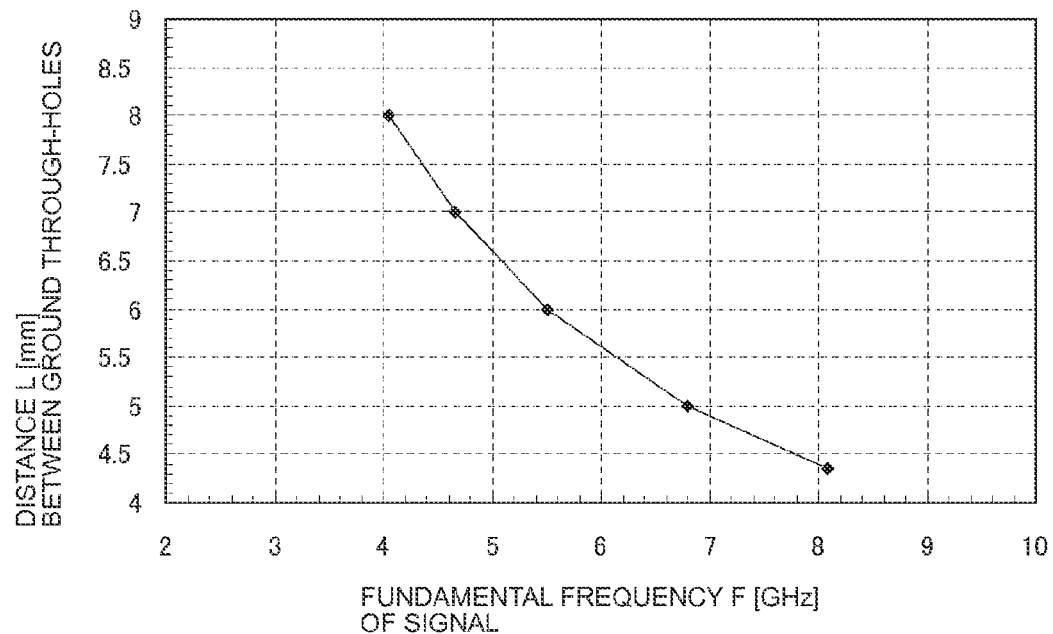
FIG. 5 is a characteristic diagram showing the relationship of the distance between ground through-holes and the fundamental frequency of signals in the second embodiment of the present invention.
FIG. 6 is a configuration diagram showing an extract of a part of the pin arrangement of the SAS connector.

In FIG. 5, when L=4.35 mm, the fundamental frequency F of signals to be passed through the connector is approximately 8.1 [GHz], when L=5.00 mm, the fundamental frequency F of signals to be passed through the connector is approximately 6.8 [GHz], when L=6.00 mm, the fundamental frequency F of signals to be passed through the connector is approximately 5.5 [GHz], and when L=8.00 mm, the fundamental frequency F of signals to be passed through the connector is approximately 4.1 [GHz].

From the relationship shown in FIG. 5, Math 1 below can be derived as the relational expression of F [GHz] and L [mm].

$$L \leq 27.3 \times F^{-0.88} \quad \text{[Math 1]}$$

At this point, when the fundamental frequency of signals to be passed through the connector is F [GHz], the distance L [mm] between the ground through-holes needs to be adjusted so that L becomes a value that is equal to, or smaller than, a value obtained by multiplying the power (−0.88) of F by 27.3.

According to this embodiment, by installing the ground through-holes 1e, 1E at positions that satisfy the conditions of Math 1 and additionally connecting such ground through-holes 1e, 1E to the ground pads 1a, 1A in addition to the ground through-holes 1c, 1C connected to the ground pads 1a, 1A, it is possible to reduce the detour of the return current in an amount that is suitable for the signal transmission rate, and the Sdd21 can be efficiently improved.

It should be noted that the present invention is not limited to the embodiments described above, and various modified examples are covered by the present invention. For example, the present invention can also be applied to a server apparatus. Here, the server apparatus is configured from a power supply system, and an electronic circuit to which power is supplied from the power supply system. The printed circuit board 100 of the first embodiment or the second embodiment is used as the electronic circuit.

Moreover, a part of the configuration of a certain embodiment may be replaced with the configuration of another embodiment, and the configuration of another embodiment may be added to the configuration of a certain embodiment. Moreover, a part of the configuration of the respective embodiments may be added to, deleted from or replaced with other configurations.

REFERENCE SIGNS LIST 1a, 1A ground pad, 1b, 1B wiring, 1c, 1C ground through-hole, 1d, 1D wiring, 1e, 1E ground through-hole, 1p, 1P ground pin, 1q, 1Q ground pin, 2a, 2A signal pad, 2b, 2B wiring, 2c, 2C signal through-hole, 5u, 5s, 5v, 5w return current path, 6k signal current path, 10, 11 ground layer, 20, 21 inner layer signal layer, 100 printed circuit board, 150 female connector, 160 male connector, 200 HDD circuit board, 300 I/O chip, 301 output circuit, 400 controller, 401 input circuit.

The invention claimed is:
1. A signal transmission circuit, comprising:
a return current transmission path against a signal transmission path for transmitting signals,
wherein the return current transmission path includes:
a ground pad formed on a circuit board surface layer; and
a plurality of ground through-holes connected to a ground layer of a circuit board inner layer and the ground pad,
wherein the plurality of ground through-holes are configured from ground through-holes that are arranged adjacent to signal through-holes in the signal transmission path, and at least one or more ground through-holes that are arranged on a side opposite to the ground through-holes with the ground pad positioned therebetween,
wherein the ground pad has a structure connected to an external wiring between the plurality of ground through-holes connected to the ground pad, and wherein, the at least one or more ground through-holes are connected to a ground layer, among the ground layers of the circuit board inner layer, in which a distance between the at least one or more ground through-holes and the ground layer is shorter than a distance between a signal pad and the ground pad.

2. The signal transmission circuit according to claim 1, wherein a distance between each of the ground through-holes is set based on a relation with a frequency of the signal.

3. The signal transmission circuit according to claim 2, wherein, in case a distance between each of the ground through-holes is L [mm] and a frequency of the signal is F [GHz], the distance between each of the ground through-holes is defined as $L \leq 27.3 \times F^{-0.88}$.

4. A server apparatus that uses the signal transmission circuit according to claim 1.

5. A printed circuit board comprising a return current transmission path against a signal transmission path for transmitting signals,
wherein the return current transmission path includes:
a ground pad formed on a circuit board surface layer; and
a plurality of ground through-holes formed on the circuit board surface layer and a circuit board inner layer, and connected to the ground pad and a ground layer of the circuit board inner layer,
wherein the plurality of ground through-holes are configured from ground through-holes arranged adjacent to signal through-holes in the signal transmission path, and at least one or more ground through-holes arranged on a side opposite to the ground through-holes with the ground pad positioned therebetween,
wherein the ground pad has a structure connected to an external wiring between the plurality of ground through-holes connected to the ground pad, and
wherein, the at least one or more ground through-holes are connected to a ground layer, among the ground layers of the circuit board inner layer, in which a distance between the at least one or more ground through-holes and the ground layer is shorter than a distance between a signal pad and the ground pad.

6. The printed circuit board according to claim 5, wherein a distance between each of the ground through-holes is set based on a relation with a frequency of the signal.

7. The printed circuit board according to claim 6, wherein, when a distance between each of the ground through-holes is L [mm] and a frequency of the signal is F [GHz], the distance between each of the ground through-holes is defined as $L \leq 27.3 \times F^{-0.88}$.

8. A server apparatus that uses the printed circuit board according to claim 5.

9. A printed circuit board comprising a return current transmission path against a signal transmission path for transmitting signals,
wherein the return current transmission path includes:
a ground pad formed on a circuit board surface layer; and
a plurality of ground through-holes formed on the circuit board surface layer and a circuit board inner layer, and connected to the ground pad and a ground layer of the circuit board inner layer,
wherein the plurality of ground through-holes are configured from ground through-holes arranged adjacent to signal through-holes in the signal transmission path, and at least one or more ground through-holes arranged on a side opposite to the ground through-holes with the ground pad positioned therebetween,
wherein, when a distance between each of the ground through-holes is L [mm] and a frequency of the signal is F [GHz], the distance between each of the ground through-holes is defined as $L \leq 27.3 \times F^{-0.88}$.

10. The printed circuit board according to claim 9, wherein, the at least one or more ground through-holes are connected to a ground layer, among the ground layers of the circuit board inner layer, in which a distance between the at least one or more ground through-holes and the ground layer is shorter than a distance between a signal pad and the ground pad.

11. A server apparatus that uses the printed circuit board according to claim 9.

* * * * *